(12) United States Patent  
Isoda

(10) Patent No.: US 6,774,406 B2  
(45) Date of Patent: Aug. 10, 2004

(54) LIGHT EMITTING DIODE DEVICE

(75) Inventor: Hiroto Isoda, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 0 days.

(21) Appl. No.: 10/303,006

(22) Filed: Nov. 25, 2002

(65) Prior Publication Data

US 2003/0102481 A1 Jun. 5, 2003

(30) Foreign Application Priority Data

Nov. 26, 2001 (JP) ........................................ 2001-360045

(51) Int. Cl.[7] .............................................. H01L 29/22
(52) U.S. Cl. ........................................ 257/99; 257/100
(58) Field of Search ................................... 257/99, 100

(56) References Cited

U.S. PATENT DOCUMENTS 6,576,930 B2 * 6/2003 Reeh et al. .................... 257/98
6,624,491 B2 * 9/2003 Waitl et al. .................. 257/434

* cited by examiner

*Primary Examiner*—Sara Crane
(74) *Attorney, Agent, or Firm*—Dennison, Schultz, Dougherty & MacDonald

(57) ABSTRACT

A light emitting diode device has a body having a recess. The body comprises a pair of half bodies made of metal and an insulation layer is provided between the half bodies. An LED is provided on a bottom of the recess. The LED is coated with a transparent coloring resin including a fluorescent material. The recess is covered by a transparent sealing plate.

5 Claims, 4 Drawing Sheets

LIGHT EMITTING DIODE DEVICE

BACKGROUND OF THE INVENTION

The present invention relates to a light emitting diode (LED) device and to a method for manufacturing the LED device.

The LED is provided for emitting light of a predetermined color only. In order to produce an LED emitting desired color light, the LED is sealed by a resin in which fluorescent material or coloring agent is included.

FIG. 4 shows a conventional LED device provided for emitting desired color light.

The LED device 50 comprises a substrate 51, first and second electrodes 52 and 53 secured on the substrate 51, an LED 54 mounted on the substrate. The LED is connected to the electrodes 52 and 53 by wires 55. The LED 54 and wires 55 are sealed by a transparent sealing resin 56. In the sealing resin 56, a fluorescent material consisting of YAG (yttrium, aluminum, gallium) and a coloring agent are included.

The LED 50 emits blue light. If the blue light strikes the fluorescent material in the sealing resin 56, the blue light changes to yellow light which discharges from the sealing resin 56. When the yellow light mixes with the blue light, white light discharges. If the white light strikes the coloring agent, the white light changes to a color of the coloring agent.

In the manufacturing process, the device is inserted in a cure furnace after the mixing of the fluorescent material with the resin, in order to solidify the resin. However, since the fluorescent material has a specific gravity heavier than that of the sealing resin 56, the fluorescent material deposits in the resin. As a result, the fluorescent material is not uniformly diffused in the resin. Therefore, it is difficult to obtain an LED device emitting desired color light.

SUMMARY OF THE INVENTION

An object of the present invention is to provide an LED device which may discharge light of a desired color.

According to the present invention, there is provided a light emitting diode device comprising a body having a recess, the body comprising a pair of half bodies made of metal, an insulation layer provided between the half bodies, an LED provided on a bottom of the recess, connecting means for connecting the LED with the half bodies, a sealing resin for sealing the connecting means, a transparent coloring resin covering at least one surface of the LED, and a transparent sealing plate for closing the recess.

The recess is formed into an inverted truncated cone.

The transparent coloring resin includes a fluorescent material.

These and other objects and features of the present invention will become more apparent from the following detailed description with reference to the accompanying drawings.

DETAILED DESCRIPTION OF THE PREFERRED EMBODIMENT

Figure 1:
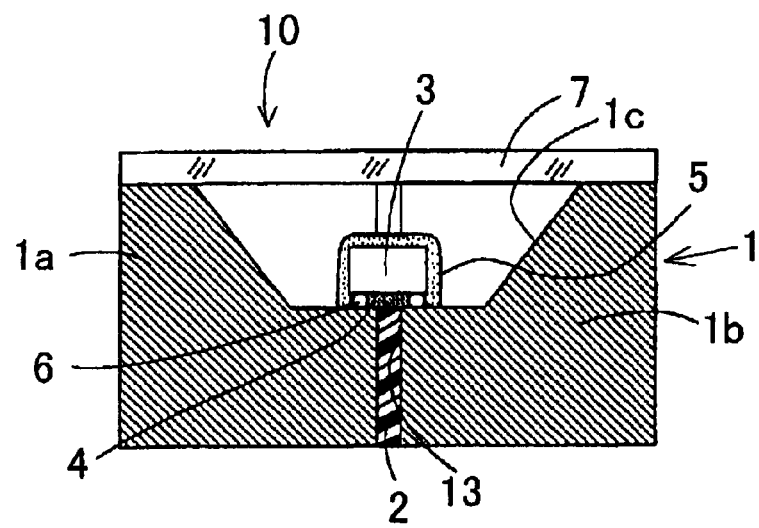
FIG. 1 is a sectional view of an LED device according to a first embodiment of the present invention.

Referring to FIG. 1, the LED device 10 comprises a cubic body 1 made of metal having a high heat conductivity (higher than 50 W/(m·K)) such as Mg group, Al group and Cu group, and having a recess 1c of an inverted truncated cone. The body 1 comprises a pair of first and second half bodies 1a and 1b, interposing an insulation layer 2 made of resin. An LED 3 is secured to the half bodies 1a and 1b by bumps 6, thereby connecting the LED 3 to a circuit through the half bodies 1a, 1b. The inside wall of the recess 1c is processed into a light reflection surface by silver plating. The underside of the LED 3 is sealed by a sealing resin 4 to increase resistance to shock and vibration, and to protect the bumps 6. At least one surface of the LED 3 is coated with a transparent coloring resin 5 in which a fluorescent material (YAG) and/or a coloring agent are included.

The recess 1c is closed by a transparent sealing plate 7 to protect the LED 3.

The LED 3 emits blue light. If the blue light strikes the fluorescent material in the sealing resin 4, the blue light changes to yellow light which discharges from the transparent sealing plate 7. When the yellow light strikes the blue light, white light discharges. If the coloring agent is included in the coloring resin 5 and the white light strikes the coloring agent, the white light changes to a color of the coloring agent.

Next, the method for manufacturing the LED device 10 is described with reference to FIGS. 3a to 3g.

Figure 2:
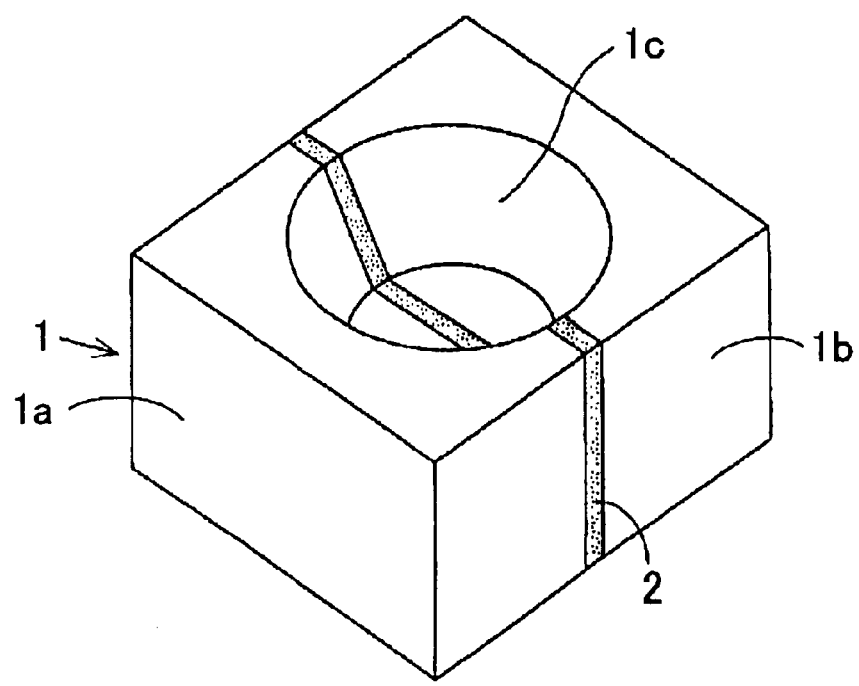
FIG. 2 is a perspective view showing a method for manufacturing the LED device.
Figure 3A:
FIGS. 3a to 3f show the manufacturing method.
Figure 3B:
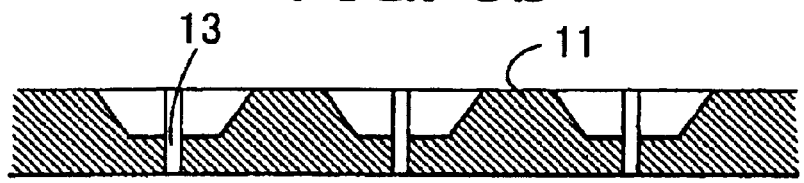
Figure 3C:
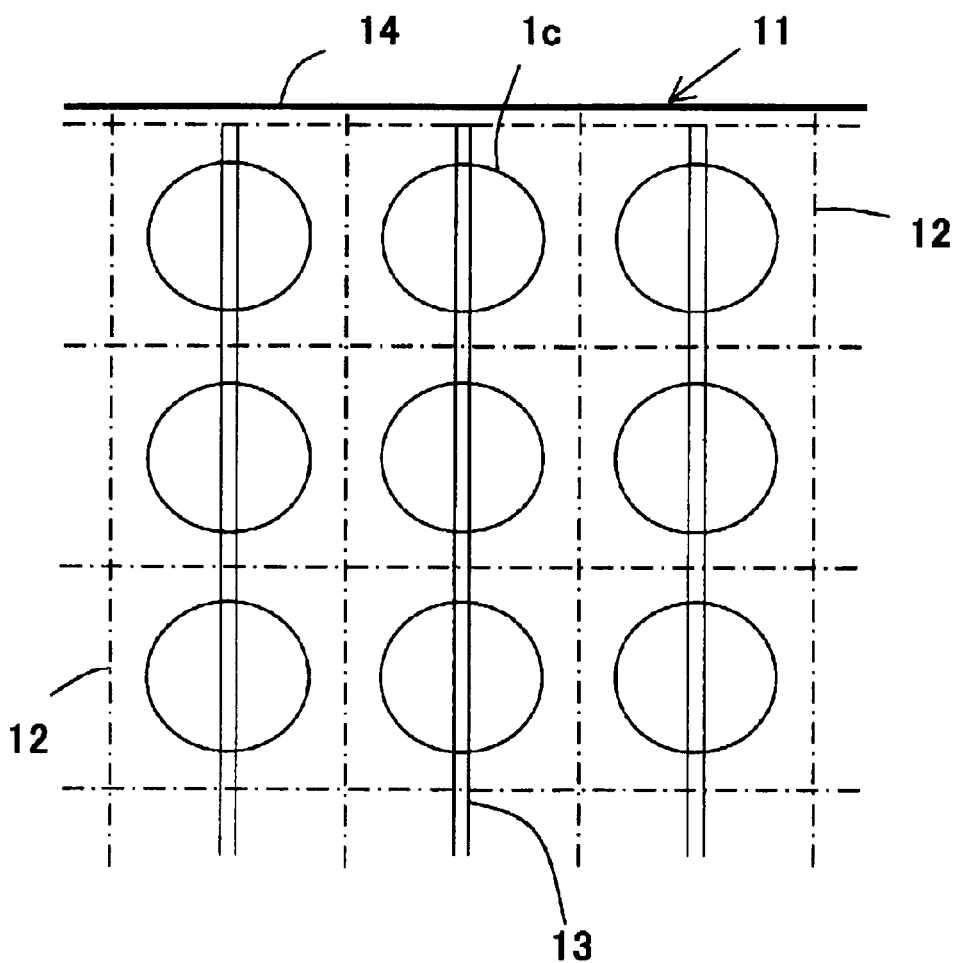
Figure 3D:
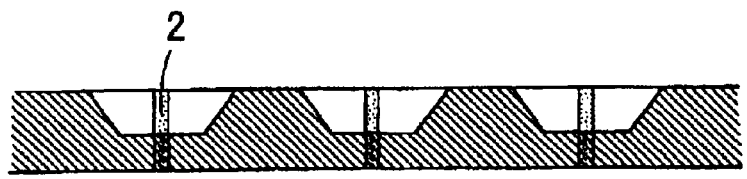
Figure 3E:
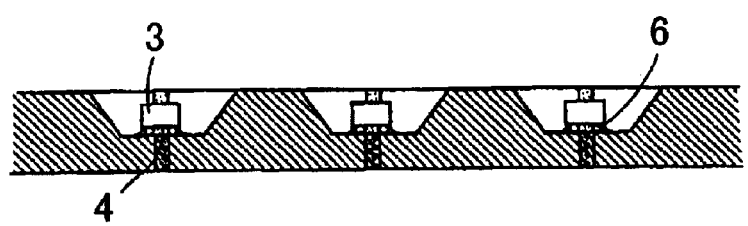
Figure 3F:
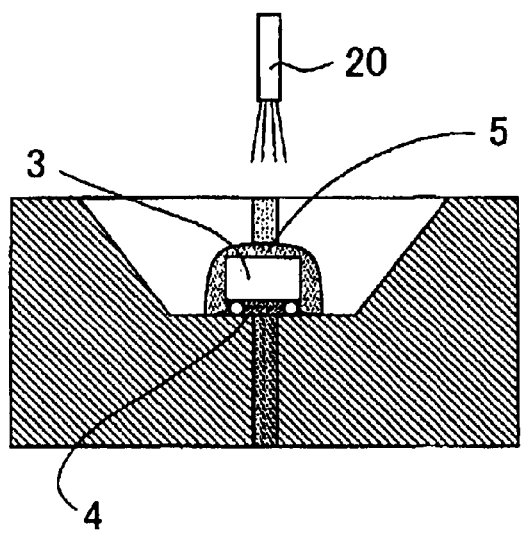
Figure 3G:
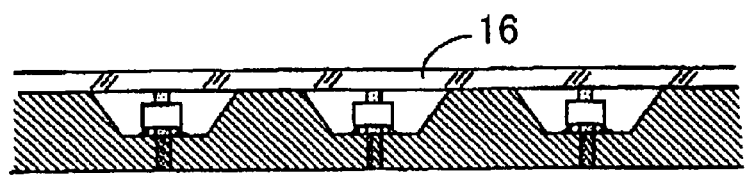
Figure 4:
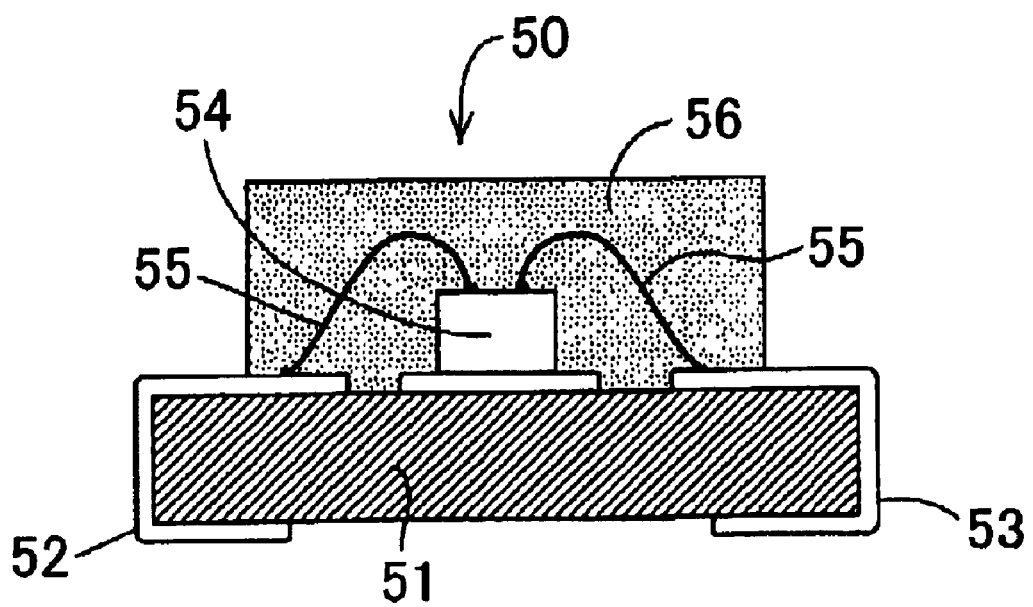
FIG. 4 is a sectional view of a conventional LED device.

As shown in FIG. 3a, a body assembly 11 comprising a plurality of LED device areas 12 (FIG. 3c) is formed by pressing a metal plate. In each of the areas 12, the recess 1c is formed. Then, in areas 12 arranged on each lateral line, a slit 13 is formed without an edge 14 as shown in FIGS. 3b and 3c. Since the edge 14 is not cut, the body assembly 11 is not divided. In each slit 13, resin is charged to form the insulation layer 2 as shown in FIG. 3d. The wall of the recess 1c is processed into a reflection surface. FIG. 2 shows each area 12. In each area 12, the LED 3 is mounted by the bumps 6 and sealing resin 4 is charged under the LED as shown in FIG. 3e. As shown in FIG. 3f there is provided an ink jet nozzle 20 which is disposed above the LED 3. The nozzle 20 projects the coloring resin 5 to the LED 3 to coat it with the resin 5. A transparent sealing plate 16 is adhered on the body assembly 11 as shown in FIG. 3g. Then, each area 12 is divided from the assembly 11, so that the LED device 10 is completed.

In accordance with the present invention, the coloring resin 5 is spread on the LED without depositing of the fluorescent material. Consequently, the fluorescent material is uniformly diffused in the coloring resin 5. Therefore, it is possible to emit desired color light by the LED device.

While the invention has been described in conjunction with preferred specific embodiment thereof, it will be understood that this description is intended to illustrate and not limit the scope of the invention, which is defined by the following claims.

What is claimed is:

1. A light emitting diode device, comprising:

a cubic body having a recess;

the body comprising a pair of half bodies made of metal, each of the half bodies having a same shape, and bosh the half bodies being symmetrically disposed with a space therebetween, and an insulation layer provided in the space between the half bodies;

an LED secured to the pair of half bodies on a bottom of the recess over the space;

connecting means for connecting and securing the LED with the half bodies;

a sealing resin for sealing the connecting means;

a transparent coloring resin covering at least one surface of the LED; and a transparent sealing plate for closing the recess.

2. The device according to claim 1, wherein the connecting means comprises at least two bumps disposed between an underside of the LED and each half body.

3. The device according to claim 1 wherein the recess is formed into an inverted truncated cone.

4. The device according to claim 1 wherein the surface of the recess is formed into a light reflecting surface.

5. The device according to claim 1 wherein the transparent wherein the transparent coloring resin includes a fluorescent material.

* * * * *